(12) United States Patent
Liu

(10) Patent No.: US 9,343,242 B2
(45) Date of Patent: May 17, 2016

(54) METHOD OF MAKING CONTACT POSTS FOR A MICROELECTROMECHANICAL DEVICE

(75) Inventor: Lianjun Liu, Chandler, AZ (US)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 1204 days.

(21) Appl. No.: 11/767,413

(22) Filed: Jun. 22, 2007

(65) Prior Publication Data

US 2008/0314723 A1    Dec. 25, 2008

(51) Int. Cl.
| | |
|---|---|
| *H01H 1/00* | (2006.01) |
| *B81C 1/00* | (2006.01) |
| *H01H 1/06* | (2006.01) |
| *H01H 1/20* | (2006.01) |
| *H01H 11/04* | (2006.01) |

(52) U.S. Cl.
CPC .......... *H01H 1/0036* (2013.01); *B81C 1/00103* (2013.01); *H01H 1/06* (2013.01); *B81B 2201/016* (2013.01); *H01H 1/20* (2013.01); *H01H 11/04* (2013.01); *Y10T 29/49105* (2015.01); *Y10T 29/49174* (2015.01)

(58) Field of Classification Search
CPC   B81C 1/0015; B81C 1/00166; B81B 3/0021; B81B 2201/014; H01H 1/0036; H01H 59/0009; Y10T 29/49174; Y10T 29/49105
USPC ....... 257/644, 647; 333/262; 225/83; 438/50, 438/52, 455; 29/930–832, 846, 851, 874, 29/622, 827, 830, 844; 330/302; 200/181; 310/12.03

See application file for complete search history.

(56) References Cited

U.S. PATENT DOCUMENTS

| | | | | |
|---|---|---|---|---|
| 5,285,103 | A   * | 2/1994  | Chen et al. | 257/644 |
| 5,578,976 | A   * | 11/1996 | Yao | 333/262 |
| 6,232,841 | B1 * | 5/2001  | Bartlett et al. | 330/302 |
| 6,706,548 | B2  | 3/2004  | Liu | |
| 6,753,747 | B2 * | 6/2004  | Ma | 335/83 |
| 6,815,739 | B2 * | 11/2004 | Huff et al. | 438/455 |
| 7,022,542 | B2 * | 4/2006  | Combi et al. | 438/52 |
| 2003/0113981 | A1 * | 6/2003 | Combi et al. | 438/424 |

OTHER PUBLICATIONS

Zavracky, et al., Micromechanical Switches Fabricated Using Nickel Surface Micromachining, p. 3-9, Journal of Microelectromechanical Systems, vol. 6, No. 1, Mar. 1997, IEEE.

* cited by examiner

*Primary Examiner* — Peter DungBa Vo
*Assistant Examiner* — Jeffrey T Carley
(74) *Attorney, Agent, or Firm* — Pearne & Gordon LLP

(57) ABSTRACT

A device 20 includes a substrate 22 coupled with a substrate 24 such that a volume 32 is formed between the substrates 22, 24. Contact posts 48, 50 on the substrate 22 and a cantilever beam structure 36 on the substrate 24 are located within the volume 32. The cantilever beam structure has a conductive trace 38 that is selectively contactable with the contact posts 48, 50 to yield a microelectromechanical (MEMS) switch within the volume 32. Fabrication methodology for making the contact posts 48, 50 entails forming post protrusions 68, 70 on the substrate 22 and shaping post protrusions 68, 70 so that they acquire a rounded shape. Input and output signal lines 42, 44 are constructed such that respective portions of input and output signal lines 42, 44 overly corresponding post protrusions 68, 70 and take on the shape of post protrusions 68, 70.

12 Claims, 4 Drawing Sheets

METHOD OF MAKING CONTACT POSTS FOR A MICROELECTROMECHANICAL DEVICE

TECHNICAL FIELD OF THE INVENTION

The present invention relates generally to semiconductor devices. More specifically, the present invention relates to a method of fabricating contact posts for microelectromechanical systems (MEMS) devices.

BACKGROUND OF THE INVENTION

MEMS technology is directed to the integration of mechanical elements, sensors, actuators, and electronics on a common substrate through the utilization of microfabrication technology. One such MEMS device is a MEMS switch. MEMS switches have the advantage of providing superior switching characteristics over a wide range of frequencies. One type of MEMS switch structure utilizes a cantilever beam design. A cantilever beam with contact metal thereon rests above an input signal line and an output signal line. During switch operation, the beam is electrostatically actuated by applying voltage to an electrode below the cantilever beam. Electrostatic force pulls the cantilever beam toward the input signal line and the output signal line, thus creating a conduction path between the input and output signal lines through the contact metal, also referred to as a shorting bar, on the cantilever beam.

A contact post is sometimes formed in each of the input and output signal lines. The contact posts form the portions of the signal lines that contact the shorting bar on the cantilever beam. Alternatively, the contact posts may be formed on the shorting bar. As such, the contact posts form the portions of the shorting bar that contact each of the signal lines. The shape, size, and height of the contact posts are important features of a MEMS switch because they define the contact area and how the switch makes contact with the shorting bar. That is, a contact post with sharp edges and protrusions at the perimeter can cause electrical arcing and degraded contacts thereby reducing the reliability of the MEMS switch. Consequently, the effective formation of contact posts is critical to MEMS switch fabrication and switch contact reliability.

The development of MEMS components is growing due to their low cost, small area, and high performance and reliability. One focus of attention has been directed toward a three-dimensional architecture of stacked substrates or wafers, with a MEMS device, such as a MEMS switch, located in a volume formed between the stacked substrates. The stacked substrates may additionally include integrated circuit device architecture along with the MEMS device thereby achieving further space savings, low cost, and high performance.

Challenges continue in the development of a more functional and cost-effective fabrication process for making MEMS switch contact posts that results in good contact post shape, size, and height control. In addition, the rising prominence of a three-dimensional architecture of stacked substrates necessitates a fabrication technique for making contact posts that is suitable for MEMS switch formation in the stacked configuration, and that achieves reliable mechanical and electrical contact characteristics.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

In one embodiment, an electronic device includes a microelectromechanical systems (MEMS) device combined with an integrated circuit architecture in a stacked configuration that includes at least two substrates, or wafers. The resulting combination can be readily and cost effectively incorporated into existing and upcoming MEMS-based systems. In another embodiment, a method of making contact posts for a MEMS switch is provided. The method involves an efficient process of forming post protrusions followed by the deposition of signal lines over the post protrusions to produce the contact posts for a MEMS switch. The method results in, among other things, the production of contact posts having a carefully controlled shape, size, and height and exhibiting good reliability and electrical characteristics. Moreover, the method is especially suitable for an electronic device having the stacked configuration. However, the method may alternatively be utilized for the fabrication of MEMS switch contact posts in a single substrate configuration in which the use of sacrificial layers may not be desired.

Figure 1:
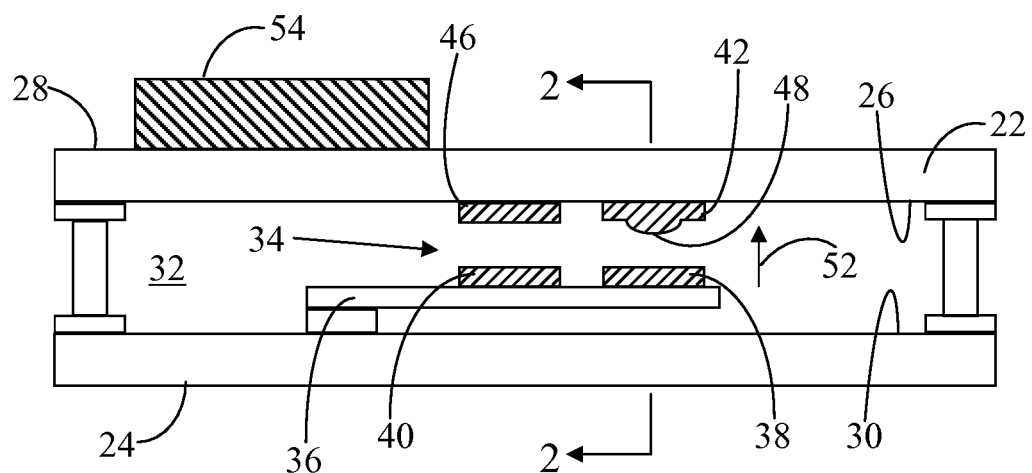
FIG. 1 shows a side view of electronic device in accordance with an embodiment of the present invention.
Figure 2:
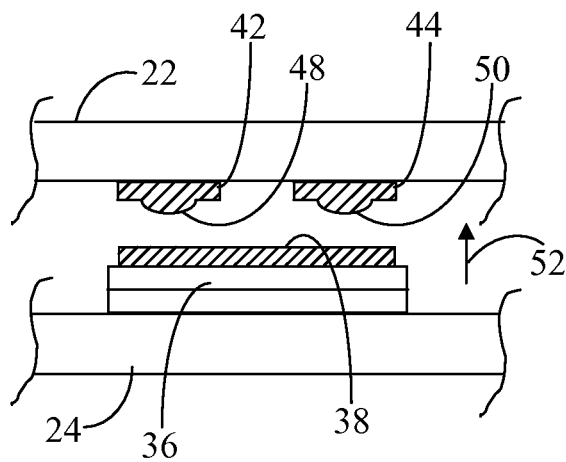
FIG. 2 shows a partial cross-sectional view taken along line 2-2 of the device shown in FIG. 1.

Referring to FIGS. 1-2, FIG. 1 shows a side view of an electronic device 20 in accordance with an embodiment of the present invention, and FIG. 2 shows a partial cross-sectional view taken along line 2-2 of device 20 shown in FIG. 1. Electronic device 20 includes a substrate 22 and another substrate 24 coupled to substrate 22. Substrate 22 has a surface 26 and an opposing surface 28. Similarly, substrate 24 includes a surface 30. Substrate 22 is coupled with substrate 24 such that surface 26 faces surface 30 to form a volume 32 between substrates 22 and 24, respectively.

As known to those skilled in the art, a wafer is typically a thin disk of semiconductor material, such as silicon crystal, which contains a plurality of integrated circuits that form a uniform patchwork over a surface of the wafer, prior to their being cut free and packaged. The plurality of distinct integrated circuits are produced when cut or etched from the silicon wafer, although these integrated circuits are not ready for use until packaged and provided with external connections. These distinct integrated circuits are typically referred to as chips or die. For purposes of the present invention, substrates 22 and 24, respectively, of electronic device 20 is that portion of a stacked configuration of silicon wafer semiconductor substrates populated by at least a microelectromechanical systems (MEMS) device and an integrated circuit, as discussed below.

In the embodiment of FIG. 1, a MEMS switch 34 is located within volume 32 and substrate 22 serves as a lid for MEMS switch 34. A cantilever beam structure 36 of MEMS switch 34 is formed on surface 30 of substrate 24. Cantilever beam structure 36 includes a conductive trace 38, or shorting bar, and an actuation electrode 40. An input signal line 42, an output signal line 44, and an actuation electrode 46 of MEMS switch 34 are formed on surface 26 of substrate 22. Input signal line 42 includes a contact post 48 extending from input signal line 42. Similarly, output signal line 44 includes a contact post 50 extending from output signal line 44. As shown, input signal line 42 and output signal line 44 are physically separated from one another and from actuation electrode 46. In addition, conductive trace 38 is positioned proximate input and output signal lines 42 and 44, respectively.

During MEMS switch 34 operation, cantilever beam structure 36 is electrostatically actuated by applying voltage between actuation electrodes 40 and 46. Electrostatic force, represented by an arrow 52, pulls cantilever beam structure 36 toward input signal line 42 and output signal line 44 until conductive trace 38 contacts each of contact posts 48 and 50, thus creating a conduction path between input and output signal lines 42 and 44, respectively. As such, substrate 22 provides a location for some elements of MEMS switch 34, namely input and output signal lines 42 and 44, and actuation electrode 46 in lieu of a conventional configuration in which input and output signal lines and an actuation electrode would typically be located beneath cantilever beam structure 36 on surface 30 of substrate 24. Such a configuration enables the deposition of input and output signal lines 42 and 44 with their associated contact posts 48 and 50, as well as actuation electrode 46, on a "starting surface," i.e., surface 26. The term "starting surface" is used herein to refer to a surface of a substrate, in this case the area of surface 26 of substrate 22 where post protrusions 68 and 70 (FIG. 6) are to be formed, that is substantially planar or flat at the onset of formation of post protrusions 68 and 70. Such a situation simplifies fabrication of contact posts 48 and 50.

In this exemplary embodiment, electronic device 20 includes an integrated circuit 54 formed on surface 28 of substrate 22. Integrated circuit 54 may be formed from a plurality of existing and upcoming passive devices, active devices, or a combination of passive and active devices that can be fabricated using semiconductor process technology. It should be understood that the inclusion of only one integrated circuit 54 on surface 28 is not a limitation of the present invention. Rather, each of surfaces 26, 28, and 30 may be populated with multiple integrated devices in accordance with a desired usage of electronic device 20. The combination of substrates 22 and 24, respectively, with their MEMS switch 36 and integrated circuit 54 forms a stacked architecture that provides benefits including improved packing density, noise immunity, improved total power due to reduced wire length/lower capacitance, superior performance, and the ability to implement added functionality.

Figure 3:
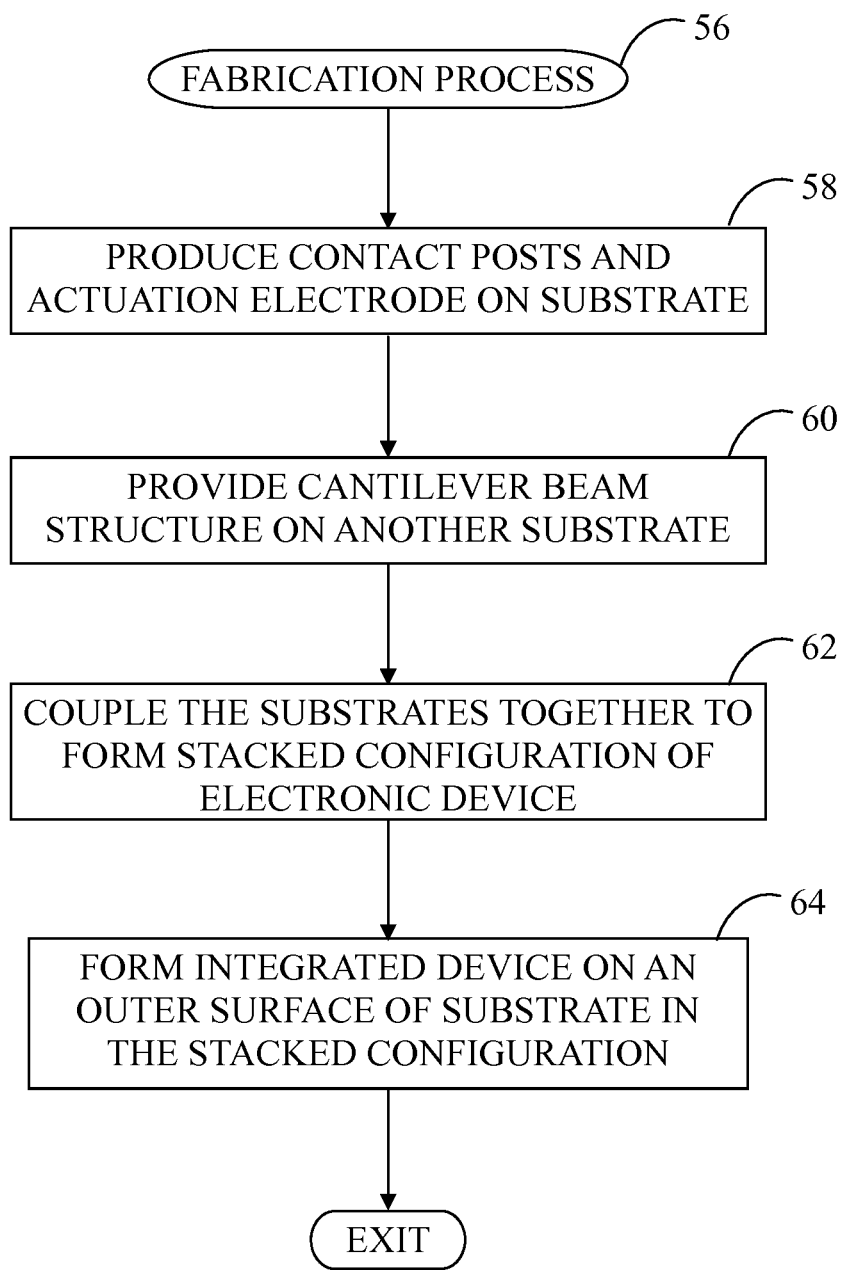
FIG. 3 shows a flowchart of a fabrication process for manufacturing the electronic device of FIG. 1.

Referring to FIG. 3 in connection with FIGS. 1-2, FIG. 3 shows a flowchart of a fabrication process 56 for manufacturing electronic device 20. Fabrication process 56 describes a cavity packaging technique in which substrate 22 is utilized as a lid or cap for cantilever beam structure 36 of MEMS switch 34 constructed on substrate 24. In addition, substrate 22 is used as a base upon which contact posts 42 and 44, and actuation electrode 46 are constructed. The stacking of substrates 22 and 24, respectively, utilizing substrate 22 as the lid makes the finished electronic device 20 more compact and more cost effective then two-dimensional architectures. In addition, substrate 22 provides a readily available surface for the fabrication of contact posts 42 and 44, and actuation electrode 46 independent from cantilever beam structure 36 thereby simplifying the fabrication of MEMS switch 34 while concurrently yielding a high reliability device. Fabrication process 56 is described below in connection with the fabrication of a single electronic device 20. However, it should be understood by those skilled in the art that the following process allows for concurrent wafer-level manufacturing of a plurality of electronic devices 20 at a time. The individual packaged devices 20 can then be cut, or diced, in a conventional manner to provide individual electronic devices 20 that are hermetically packaged.

Process 56 includes a task 58 in which input and output signal lines 42 and 44 and actuation electrode 46 are provided on surface 26 of substrate 22. The details of this fabrication methodology will be discussed in connection with FIGS. 4-7.

Next, a task 60 is performed. At task 60, cantilever beam structure 36 is provided on surface 30 of substrate 24. Cantilever beam structure 36 can be fabricated in accordance with known MEMS fabrication processes. These MEMS fabrication processes include, for example, deposition processes, photolithography, wet and dry etching processes, and bulk micromachining. It should be noted that task 58 pertains to the fabrication of that portion of MEMS switch 34 located on surface 26 of substrate 22 and task 60 pertains to the fabrication of cantilever beam structure 36 of MEMS switch 34 located on surface 30 of substrate 24. These tasks are described herein as being serial operations for simplicity. However, it should be understood that these distinct fabrication tasks may be performed in parallel in separate areas of a single manufacturing facility or these distinct fabrication tasks may be performed at different manufacturing facilities.

Fabrication process 56 continues with a task 62. At task 62, substrates 22 and 24, respectively, are coupled to form volume 32 in which cantilever beam structure 36, input and output signal lines 42 and 44, conductive trace 38, and actuation electrodes 40 and 46 are located. Coupling of substrates 22 and 24 may be achieved through application of bonding layers on corresponding bonding perimeters of surface 26 of substrate 22 and surface 30 of substrate 24. The bonding layers may be metallic bond rings that couple to one another to form a hermetically sealed joint surrounding volume 32. The bonding layers can be a number of different materials typically used for creating the hermetically sealed joint. Such materials include, for example, gold, indium, aluminum, copper, silver, alloys thereof, and compounds thereof. It should be understood, however, that if a hermetic seal is not desired, the bonding layers may alternatively be formed from filled epoxies or filled silicones. Following task 62, a task 64 is performed. At task 64, integrated circuit 54 is formed on surface 28 of substrate 22 using a semiconductor process technology. In accordance with known semiconductor fabrication techniques, integrated circuit 54 may be formed on surface 28 of substrate 22 using one or more metal layers and dielectric layers. Following task 64, fabrication process 56 is complete and process 56 exits.

Figure 4:
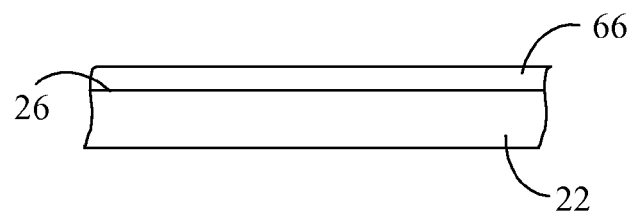
FIG. 4 shows a cross-sectional view of a portion of a substrate of the electronic device of FIG. 1 at a beginning stage of fabrication according to another embodiment of the invention.

FIG. 4 shows a cross-sectional view of a portion of substrate 22 of electronic device 20 (FIG. 1) at a beginning stage of fabrication according to another embodiment of the invention. The following figures beginning with FIG. 4 through FIG. 7 illustrate some of the processing operations performed to produce contact posts 48 and 50 in accordance with task 58 (FIG. 3) of fabrication process 56 (FIG. 3). First, substrate 22 is provided which provides a structural or mechanical support for overlying structures. Substrate 22 may be fabricated from a semiconducting material such as silicon, gallium arsenide, germanium, and the like, utilizing conventional processes and polished to obtain a very regular and flat surface.

Next, a thin film 66 is deposited on surface 26 of substrate 22. Thin film 66 may be a dielectric or polymer thin film. Exemplary dielectric thin films include doped silicon dioxide such as Boron-Silicate Glass (BSG), Phospho Silicate Glass (PSG), Boron-Doped Phosphosilicate Glass (BPSG), and so forth. Exemplary polymer thin films include polyimide, benzocyclobutene (BCB), and so forth. In another embodiment discussed below, thin film 66 may alternatively be a metal thin film material.

Figure 5:
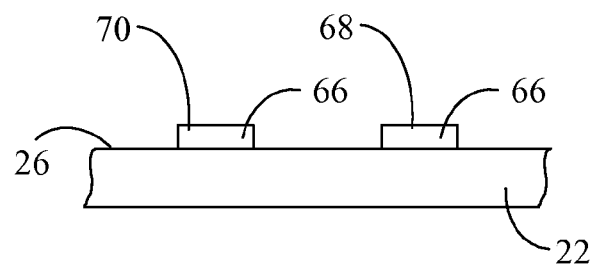
FIG. 5 shows a cross-sectional view of the portion of the substrate shown in FIG. 4 further along in processing.

FIG. 5 shows a cross-sectional view of the portion of substrate 22 shown in FIG. 4 further along in processing. A portion of thin film 66 is selectively removed from substrate 22 to form post protrusions 68 and 70. Selective removal of thin film 66 may be performed by utilizing a conventional etching process to shape post protrusions 68 and 70. Alternatively, selective removal of thin film 66 may be accomplished utilizing a photolithographic process to photolithographically define post protrusions 68 and 70.

Figure 6:
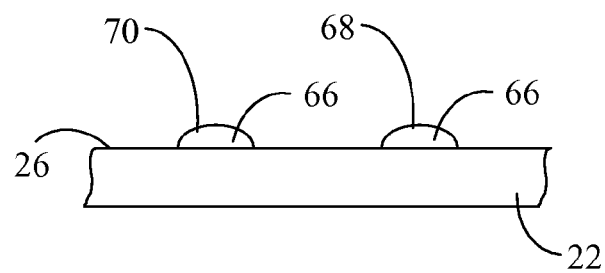
FIG. 6 shows a cross-sectional view of the portion of the substrate shown in FIG. 5 further along in processing.

FIG. 6 shows a cross-sectional view of the portion of substrate 22 shown in FIG. 5 further along in processing. Following the selective removal operations represented in FIG. 5, the resulting post protrusions 68 and 70 have relatively sharp rough outer edges. These sharp outer edges can cause electrical arcing and reduced reliability of MEMS switch 34 (FIG. 1). To counter this problem, the remaining pattern of thin film 66 that makes up post protrusions 68 and 70 is heated until it deforms, or partially melts. This process is sometimes referred to as thermal reflow. Thin film 66 is heated to a particular temperature for a duration that is sufficient for post protrusions to acquire a rounded or domed shape, as shown in FIG. 6. For example, BSG, PSG, and BPSG reflows at temperatures varying between 700-1000° C., and polyimide and BCB reflows at a temperature of approximately 250° C. in accordance with known methodologies.

Figure 7:
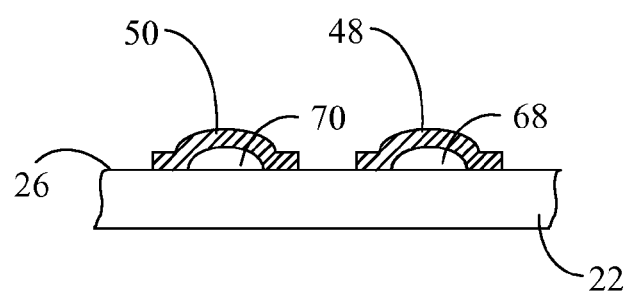
FIG. 7 shows a cross-sectional view of the portion of the substrate shown in FIG. 6 further along in processing.

FIG. 7 shows a cross-sectional view of the portion of substrate 22 shown in FIG. 6 further along in processing. Once the reflow process is complete, input signal line 48 and output signal line 50 are constructed. Preferably, input signal line 48, output signal line 50, and actuation electrode 46 (FIG. 1) are formed of the same material(s) and at the same time. Input signal line 48, output signal line 50, and actuation electrode 46 may be formed by depositing a metal layer over substrate 22 and post protrusions 68 and 70. A lift-off process or patterning technique may be employed to form input signal line 48, output signal line 50, and actuation electrode 46.

A portion of the metal layer over each of post protrusions 68 and 70 takes on the rounded, or semi-spherical, shape of contact posts 48 and 50. This rounded configuration of contact posts 48 and 50 results in relatively smooth effective contacts that mitigate the problems associated with sharp edges. Moreover, through the use of deposition, selective material removal, and overlaying a metal layer, the size, shape, and height of the contact posts can be tightly controlled. In addition, this contact post fabrication process is performed in the absence of forming any sacrificial layer, making it suitable for fabrication on surface 26 of substrate 22 where a sacrificial layer is not needed and would unnecessarily add process steps.

Figure 8:
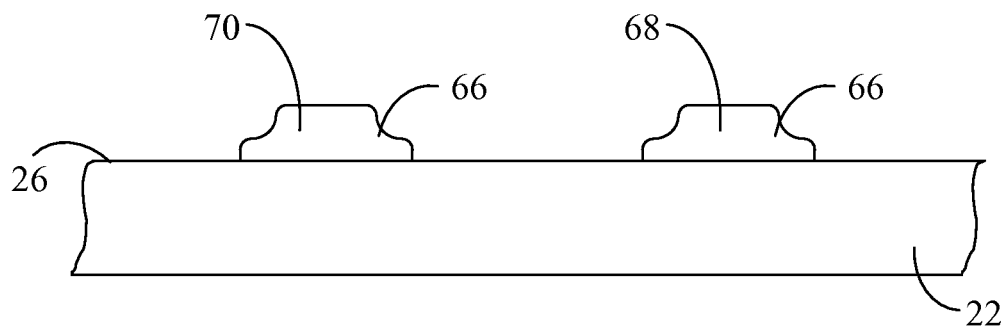
FIG. 8 shows a cross-sectional view of the portion of the substrate shown in FIG. 5 further along in processing in accordance with another embodiment of the invention.

FIG. 8 shows a cross-sectional view of the portion of substrate 22 shown in FIG. 4 further along in processing in accordance with another embodiment of the invention. Thin film 66 may be dielectric, polymer, or a metal thin film that is deposited on substrate 22, as discussed in connection with FIG. 4. In accordance with this embodiment of the invention, post protrusions 68 and 70 are formed using an isotropic etching process. As is well known to those skilled in the art, etching entails depositing "masking" material over those parts of thin film 66 that are to be protected from the etchant. The masking material resists etching so that the etching process removes a layer of material without damaging the masked areas. An isotropic etchant can undercut the masking layer to form sloping sidewalls in the remaining thin film 66. Accordingly, following isotropic etching, post protrusions 68 and 70 have sloped, or rounded sidewalls.

Figure 9:
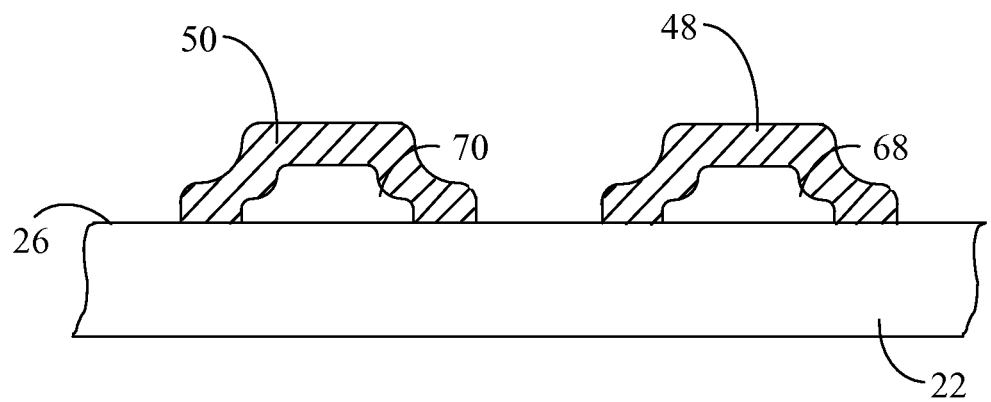
FIG. 9 shows a cross-sectional view of the portion of the substrate shown in FIG. 8 further along in processing.

FIG. 9 shows a cross-sectional view of the portion of substrate 22 shown in FIG. 8 further along in processing. Following isotropic etching, input signal line 48, output signal line 50, and actuation electrode 46 (FIG. 1) are constructed as discussed above in connection with FIG. 7. A portion of the metal layer over each of post protrusions 68 and 70 produces rounded shape contact posts 48 and 50. Again, this rounded configuration of contact posts 48 and 50 results in effective contacts that mitigate the problems associated with sharp edges. In addition, contact post size, shape, and height can be tightly controlled, and contact posts can be fabricated in the absence of forming any sacrificial layer making the methodology suitable for the stacked substrate configuration of electronic device 20 (FIG. 1).

Figure 10:
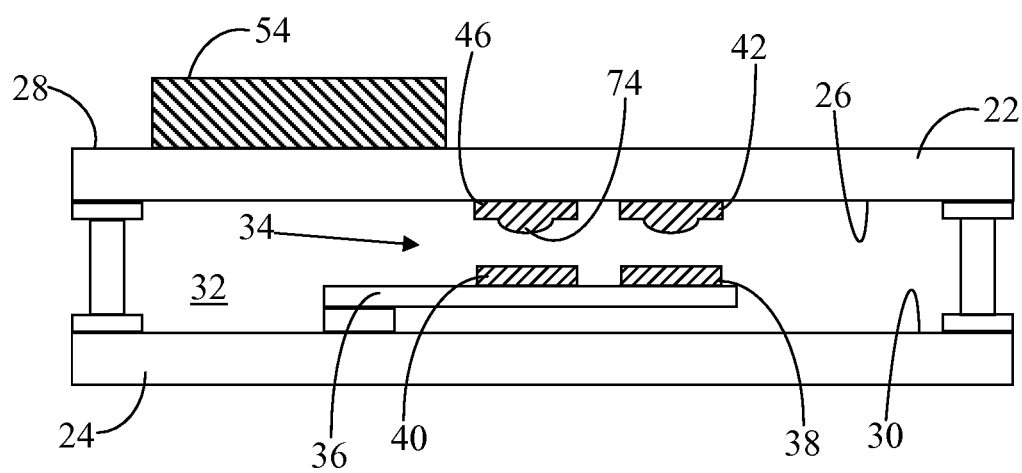
FIG. 10 shows a side view of an electronic device in accordance with another embodiment of the present invention.

FIG. 10 shows a side view of an electronic device 72 in accordance with another embodiment of the present invention. Electronic device 72 includes many features that are similar to electronic device 20 including MEMS switch 34 with cantilever beam structure 36 formed on surface 30 of substrate 24, input and output signal lines 48 and 50 formed on surface 26 of substrate 22, and integrated circuit 54 formed on surface 28 of substrate 22. In addition, electronic device 72 includes actuation electrode 40 formed on cantilever beam structure 36 and actuation electrode 46 formed on surface 26 of substrate 22. However, in this embodiment, actuation electrode 46 is fabricated to include a contact post 74 in accordance with the fabrication processes described in connection with FIGS. 4-9.

In some instances, the voltage applied to actuation electrode 46 can produce an electrostatic force that pulls cantilever beam structure 36 toward surface 26 of substrate 22 with enough force that actuation electrodes 40 and 46 can at least temporarily "stick" together. This sticking can reduce the effectiveness and reliability of the switch. Inclusion of contact post 74 with actuation electrode 46 results in lower surface area contact between actuation electrodes 40 and 46 thereby reducing the potential for electrodes 40 and 46 to stick together.

An embodiment described herein comprises an electronic device that includes two substrates in a stacked configuration. Two substrates are coupled to produce a volume between the substrates. A microelectromechanical systems (MEMS) switch is formed on facing surfaces of the substrates within the volume. A cantilever beam structure of the MEMS switch is formed on a surface of one of the substrates, and signal lines and an actuation electrode are formed on a facing surface of the other substrate. The signal lines, and optionally the actuation electrode, are fabricated to include contact posts.

Another embodiment comprises methodology for fabricating the contact posts for the electronic device. The contact posts are manufactured utilizing underlying post protrusions that have a rounded shape so that subsequently deposited signal lines are produced that also have rounded contact posts. The rounded configuration of the contact posts results in effective contacts that mitigate the problems associated with sharp edges and results in the tight control of size, shape, and height of the contact posts. In addition, the contact post fabrication methodology is performed in the absence of forming any sacrificial layer, making it suitable for fabrication in the stacked configuration of the electronic devices described herein. Moreover, the signal lines with contact posts can be fabricated on a starting surface of one of the substrates independent from the fabrication of elements, such as the cantilever beam structure on the other substrate, thus simplifying the overall process, improving yield, and reducing manufacturing costs.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A method of making a solid contact post for a microelectromechanical device comprising:
    providing a first substrate;
    forming a solid post protrusion extending from said first substrate by depositing a thin film on said first substrate and selectively removing a portion of said thin film from said first substrate to form said solid post protrusion from the non-removed portion of said thin film, wherein said solid post protrusion is in direct contact with the first substrate such that there is no gap or other material between the first substrate and the solid post protrusion;
    shaping said solid post protrusion to acquire a rounded shape; and
    producing a solid contact post exhibiting said rounded shape by overlying said solid post protrusion with a portion of a signal line, said produced solid contact post having no internal cavity formed therein and having no gaps formed in said portion of said signal line overlying said solid post protrusion, said produced solid contact post serving with a selectively contactable conductive trace to actuate the microelectromechanical device;
    providing a second substrate; forming a cantilever beam structure on said second substrate, said cantilever beam structure having the conductive trace positioned thereon; and coupling said second substrate with said first substrate to form a volume between said first and second substrates, said solid contact post on said first substrate and said cantilever beam structure on said second substrate being located within said volume.

2. A method as claimed in claim 1 wherein:
    said removing operation comprises etching said thin film; and
    said shaping operation comprises heating said thin film following said etching until said solid post protrusion acquires said rounded shape.

3. A method as claimed in claim 1 wherein:
    said removing operation comprises performing a photolithographic process on said thin film; and
    said shaping operation comprises heating said thin film following said photolithographic process until said solid post protrusion acquires said rounded shape.

4. A method as claimed in claim 1 wherein said removing and shaping operations comprise performing an isotropic etch process on said thin film so that said solid post protrusion acquires said rounded shape.

5. A method as claimed in claim 1 wherein said forming operation comprises utilizing one of a dielectric, a polymer, and a metal thin film to form said solid post protrusion.

6. A method as claimed in claim 1 further comprising producing said solid contact post with said rounded shape in absence of forming any sacrificial layer.

7. A method as claimed in claim 1 wherein said solid post protrusion is a first solid post protrusion, said signal line is an input signal line, said solid contact post is a first solid contact post, and said method further comprises:
    forming a second solid post protrusion extending from said first substrate;
    shaping said second solid post protrusion to acquire said rounded shape;
    constructing an output signal line, a portion of said output signal line overlying said second solid post protrusion to produce a second solid contact post exhibiting said rounded shape, said portion of said output signal line in combination with said second solid post protrusion producing said second solid contact post having no internal cavity formed therein and having no gaps formed in said portion of said output signal line overlying said second solid post protrusion wherein said conductive trace is selectively contactable with said first and second solid contact posts to actuate said microelectromechanical device.

8. A method as claimed in claim 1 wherein said first substrate includes a first surface and a second surface, said solid contact post is formed on said first surface, and said method further comprises constructing an integrated circuit on said second surface of said first substrate following said coupling operation.

9. A method as claimed in claim 1 wherein said first substrate includes a first surface and a second surface, said solid contact post is formed on said first surface, and said method further comprises constructing an integrated circuit on said second surface of said first substrate following construction of said solid contact post on said first surface.

10. A method as claimed in claim 9 wherein said constructing said integrated circuit comprises forming at least one said integrated circuit on said second surface of said first substrate using a semiconductor process technology, said at least one said integrated circuit including at least one of a passive device and an active device.

11. A method as claimed in claim 7 wherein said first substrate is substantially planar and said method further comprises concurrently forming said first and second solid post protrusions on said substantially planar substrate.

12. A method as claimed in claim 7 further comprising:
    forming a third solid post protrusion extending from said first substrate;
    shaping said third solid post protrusion to acquire a rounded shape; and
    constructing an electrode, a portion of said electrode overlying said third solid post protrusion to produce a solid electrode post exhibiting said rounded shape, said portion of said electrode in combination with said third solid post protrusion producing said solid electrode post having no internal cavity formed therein and having no gaps formed in said portion of said electrode overlying said solid electrode post.

* * * * *